(12) United States Patent
Bridges et al.

(10) Patent No.: US 8,325,480 B2
(45) Date of Patent: Dec. 4, 2012

(54) HEAT SINK FOR DISTRIBUTING A THERMAL LOAD

(75) Inventors: Jeremy S. Bridges, Durham, NC (US); Paul J. La Rocca, Rochester, MN (US); William M. Megarity, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/783,830

(22) Filed: May 20, 2010

(65) Prior Publication Data

US 2011/0286178 A1 Nov. 24, 2011

(51) Int. Cl.
*H05K 7/20* (2006.01)

(52) U.S. Cl. ............... 361/679.54; 361/679.46; 361/704; 361/707; 361/690; 165/80.3; 165/122; 165/185

(58) Field of Classification Search ............. 361/679.46–679.54, 690–697, 361/704–712, 715–722; 257/706–727; 165/80.3, 165/104.22, 121–126, 185; 174/15.2, 16.3, 174/252; 454/184
See application file for complete search history.

(56) References Cited

U.S. PATENT DOCUMENTS

| | | | |
|---|---|---|---|
| 5,473,508 A | 12/1995 | Porter et al. | |
| 5,604,665 A | 2/1997 | Chrysler et al. | |
| 5,653,285 A * | 8/1997 | Lee | 165/185 |
| 5,829,515 A | 11/1998 | Jeffries et al. | |
| 5,912,800 A * | 6/1999 | Sammakia et al. | 361/690 |
| 5,957,194 A * | 9/1999 | Azar | 165/80.3 |
| 6,125,921 A * | 10/2000 | Kuo | 165/80.3 |
| 6,234,239 B1 * | 5/2001 | Azar | 165/80.3 |
| 6,236,565 B1 | 5/2001 | Gordon | |
| 6,269,003 B1 * | 7/2001 | Wen-Chen | 361/704 |
| 6,400,568 B1 | 6/2002 | Kim et al. | |
| 6,462,948 B1 | 10/2002 | Leija et al. | |
| 6,575,229 B1 * | 6/2003 | Taban | 165/80.3 |
| 7,193,316 B2 | 3/2007 | Mongia et al. | |
| 7,228,889 B1 * | 6/2007 | Tian et al. | 165/122 |
| 7,244,637 B2 | 7/2007 | Hembree | |
| 7,278,468 B2 | 10/2007 | Joshi et al. | |
| 7,423,873 B2 * | 9/2008 | Shuai et al. | 361/697 |
| 7,583,502 B2 | 9/2009 | Tsao et al. | |

FOREIGN PATENT DOCUMENTS

TW 200726388 * 7/2007
* cited by examiner

*Primary Examiner* — Michail V Datskovskiy
(74) *Attorney, Agent, or Firm* — H. Barrett Spraggins; Thomas E. Tyson; Biggers & Ohanian, LLP

(57) ABSTRACT

Heat sinks for distributing a thermal load are disclosed that include: a bottom plate; a front top plate; a back top plate; and a plurality of heat-dissipating fins connected to the bottom plate, the front top plate, and the back top plate, wherein the front top plate and the back top plate are separated by a predetermined distance.

14 Claims, 4 Drawing Sheets

Receiving, In A Heat Sink, A Thermal Load From A Thermal Source (e.g., A Computer Processor), Wherein The Heat Sink Includes A Bottom Plate, A Front Top Plate, A Back Top Plate, And A Plurality Of Heat-dissipating Fins Connected To The Bottom Plate, The Front Top Plate, And The Back Top Plate, Wherein The Front Top Plate And The Back Top Plate Are Separated By A Predetermined Distance Distance Thereby Creating An Opening Between The Front Top Plate And The Back Top Plate And Exposing One Or More Interior Chambers Between Two Particular Adjacent Heat-dissipating Fins
402

Transferring The Thermal Load To The Heat-dissipating Fins, The Front Top Plate, And The Back Top Plate, Through A Conductive Heat Path
404

Receiving, Via An Opening In The Heat Sink Between The Front Top Plate And The Back Top Plate Of The Heat Sink, Airflow From An Air Source (e.g., A Fan)
406

FIG. 4

HEAT SINK FOR DISTRIBUTING A THERMAL LOAD

BACKGROUND OF THE INVENTION

1. Field of the Invention

The field of the invention is heat sinks for distributing a thermal load, including methods and apparatus that make use of heat sinks for distributing a thermal load.

2. Description of Related Art

Modern computer systems typically include a combination of hardware and software components, application programs, operating systems, processors, buses, memory, input/output devices, and so on. In order to deliver powerful computing resources, computer system designers must design powerful computer processors. Current computer processors, for example, are capable of executing billions of computer program instructions per second. Operating these computer processors requires a significant amount of power, and often such processors can consume over 100 watts. Consuming significant amounts of power generates a considerable amount of heat. Unless the heat is removed, heat generated by a computer processor may degrade or destroy the processor's functionality. To prevent the degradation or destruction of a computer processor, a computer architect may remove heat from the processor by using heat sinks, fans, heat pipes, or even refrigeration systems.

SUMMARY OF THE INVENTION

A heat sink for distributing a thermal load is disclosed that includes a bottom plate, a front top plate, a back top plate, and a plurality of heat-dissipating fins connected to the bottom plate, the front top plate, and the back top plate, wherein the front top plate and the back top plate are separated by a predetermined distance.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 4 sets forth a flow chart illustrating an exemplary method for distributing a thermal load.

DETAILED DESCRIPTION OF EXEMPLARY EMBODIMENTS

Figure 1:
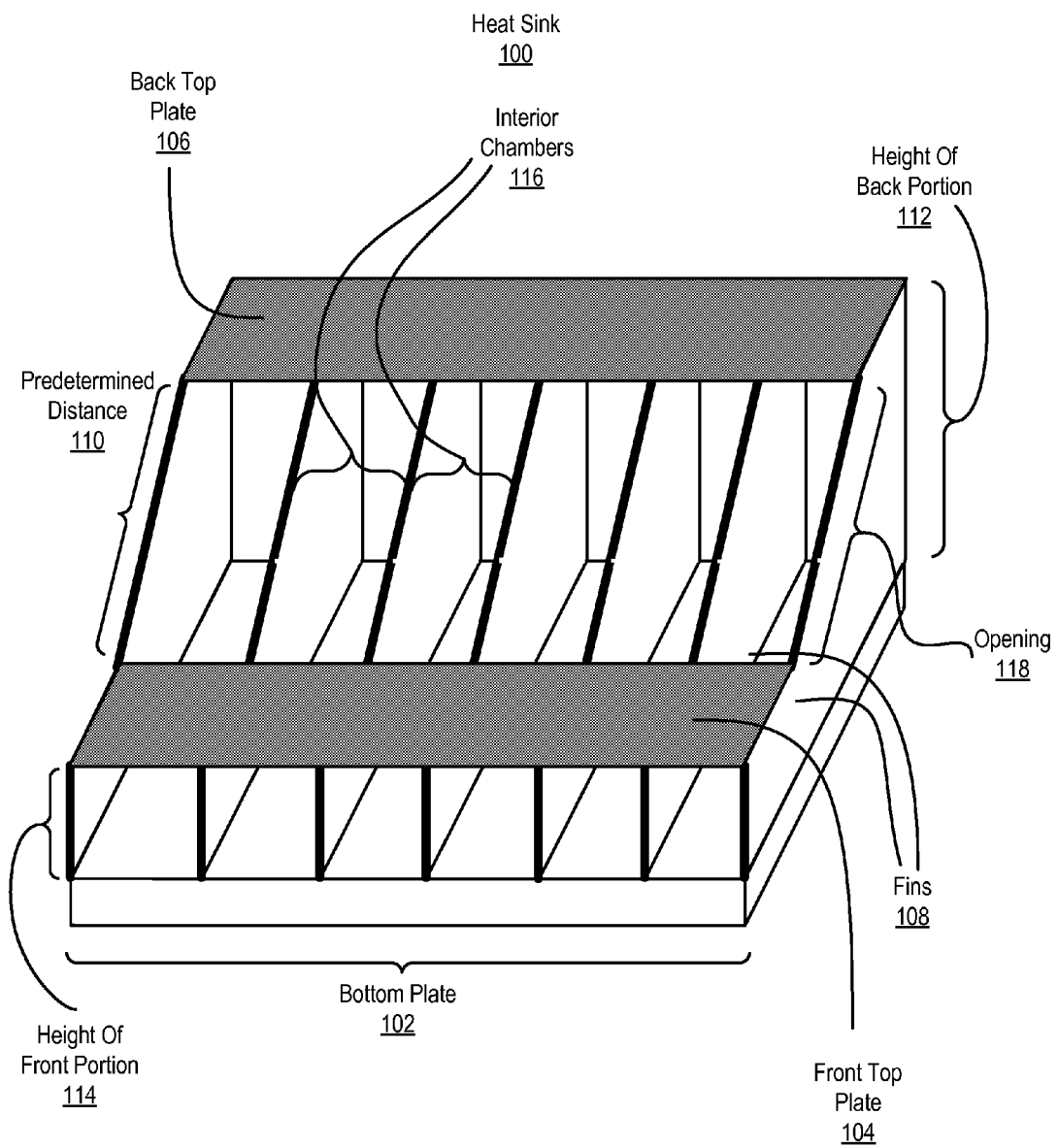
FIG. 1 sets forth a perspective view of a heat sink for distributing a thermal load.

Exemplary methods, apparatus, and heat sinks for distributing a thermal load in accordance with the present invention are described with reference to the accompanying drawings, beginning with FIG. 1. FIG. 1 sets forth a perspective view of a heat sink (100) for distributing a thermal load according to embodiments of the present invention. The thermal load is the rate of thermal energy produced over time from the operation of an integrated circuit package (not shown) such as, for example, a computer processor or memory chip and is typically expressed in units of Watts.

In the example of FIG. 1, the heat sink (100) is a thermal conductor configured to absorb and dissipate the thermal load from an integrated circuit package thermally connected with the heat sink (100). Thermal conductors used in designing the heat sink (100) may include, for example, aluminum, copper, silver, aluminum silicon carbide, or carbon-based composites. The heat sink (100) of FIG. 1 may absorb the thermal load from the integrated circuit package through thermal conduction. When thermally connecting the heat sink (100) to the integrated circuit package, the heat sink provides additional thermal mass, cooler than the integrated circuit package, into which the thermal load may flow. After absorbing the thermal load, the heat sink (100) dissipates the thermal load through thermal convection and thermal radiation into the air surrounding the heat sink (100). Increasing the surface area of the heat sink (100) typically increases the rate of dissipating the thermal load.

In the example of FIG. 1, the heat sink (100) includes a bottom plate (102), a front top plate (104), and a back top plate (106). In the example of FIG. 1, the bottom plate (102) may thermally connect the heat sink (100) to an integrated circuit package such as, for example, a computer processor. The front top plate (104) and the back top plate (106) of FIG. 1 can connect to a plurality of heat-dissipating fins (108) that are connected to the bottom plate (102). The front top plate (104) and the back top plate (106) of FIG. 1 may receive a thermal load from bottom plate (102) via the heat-dissipating fins (108).

In the example of FIG. 1, the heat sink (100) includes a plurality of heat-dissipating fins (108) that are connected to the bottom plate (102), the front top plate (104), and the back top plate (106). The front top plate (104), the back top plate (106), and the heat-dissipating fins (108) each serve to increase the surface area of the heat sink (100) as the front top plate (104), the back top plate (106), and the heat-dissipating fins (108) each serve as an additional surface for receiving a thermal load. The thermal load received by the front top plate (104), the back top plate (106), and the heat-dissipating fins (108) may be dissipated, for example, through thermal convection and thermal radiation into the air surrounding the heat sink (100).

In the example of FIG. 1, the front top plate (104) and the back top plate (106) are separated by a predetermined distance (110) thereby creating an opening (118) between the front top plate (104) and the back top plate (106) and exposing one or more interior chambers (116) between two particular adjacent heat-dissipating fins (108). The heat sink (100) of FIG. 1 includes an opening (118) in the sense that some portions of the heat-dissipating fins (108) are connected to the front top plate (104) or the back top plate (106) while other portions of the heat-dissipating fins (108) are not connected to a top plate, thereby enabling airflow to enter and exit the opening (118). Airflow may be provided to the heat sink (100) through the use of one or more cool air sources, such as one or more fans, that deliver one or more streams of airflow to the heat sink (100). Airflow entering the heat sink (100) via the opening (118) may flow into the interior chambers (116) of the heat sink (100). In the example of FIG. 1, such interior chambers (116) represent the space between two adjacent heat-dissipating fins (108). Cool air may therefore enter the heat sink (100) of FIG. 1 via the opening (118) between the front top plate (104) and the back top plate (106) and hot air may exit the via the opening (118) between the front top plate (104) and the back top plate (106).

In the example of FIG. 1, a height (112) of a back portion of each heat-dissipating fin (108) may be greater than a height (114) of a front portion of each heat-dissipating fin (108) by a predetermined amount. For example, the height (112) of the back portion of each heat-dissipating fin (108) may be approximately twice the height (114) of front portion of each heat-dissipating fin (108). Because the height (112) of the back portion of each heat-dissipating fin (108) is greater than the height (114) of the front portion of each heat-dissipating fin (108), cool air may be delivered to the opening between the front top plate (104) and the back top plate (106) by a cool air source, such as one or more fans, that are mounted in front of the heat sink (100). In an embodiment in which there was no difference in height between the back portion of each heat-dissipating fin (108) and the front portion of each heat-dissipating fin (108), a cool air source mounted in front of the heat sink (100) could not efficiently deliver airflow to an opening in the heat sink (100). For example, the cool air source could be mounted directly above the heat sink (100) in order to deliver cool air via the opening between the front top plate (104) and the back top plate (106), the cool air source could use a duct to deliver cool air via the opening between the front top plate (104) and the back top plate (106), or the cool air source could make use of other air delivery mechanisms. In the example of FIG. 1, because there is a difference between the heights (112, 114) of the back portion of each heat-dissipating fin (108) and the front portion of each heat-dissipating fin (108), cool air can be delivered not only via a duct or from a cool air source mounted above the heat sink (100) but also by a cool air source mounted in front of the heat sink (100) and oriented to deliver air flow that flows above the top of the front portion each heat-dissipating fin (108) and below the top of the back portion of each heat-dissipating fin (108).

In the example of FIG. 1, the front top plate (104) and the back top plate (106) are depicted as being identically sized. Although the front top plate (104) and the back top plate (106) may be identically sized, the front top plate (104) and the back top plate (106) may also be differently sized. For example, the depth, width, thickness, or other dimension of the front top plate (104) and the back top plate (106) of FIG. 1 may be different.

In the example of FIG. 1, the heat-dissipating fins (108) may be oriented with respect to one or more fans (not shown) such that airflow from the fans is received via an opening in the heat sink between the front top plate (104) and the back top plate (106). The airflow from the fan may be received via the opening in the heat sink between the front top plate (104) and the back top plate (106) such that cool air provided by the fan is ducted into the heat sink (100). The cool air ducted into the heat sink (100) may be used to reduce the temperature of the front top plate (104), the back top plate (106), and the heat-dissipating fins (108) while also mixing with air that is already in the heat sink (100) to reduce the ambient temperature of air in the heat sink (100).

Figure 2:
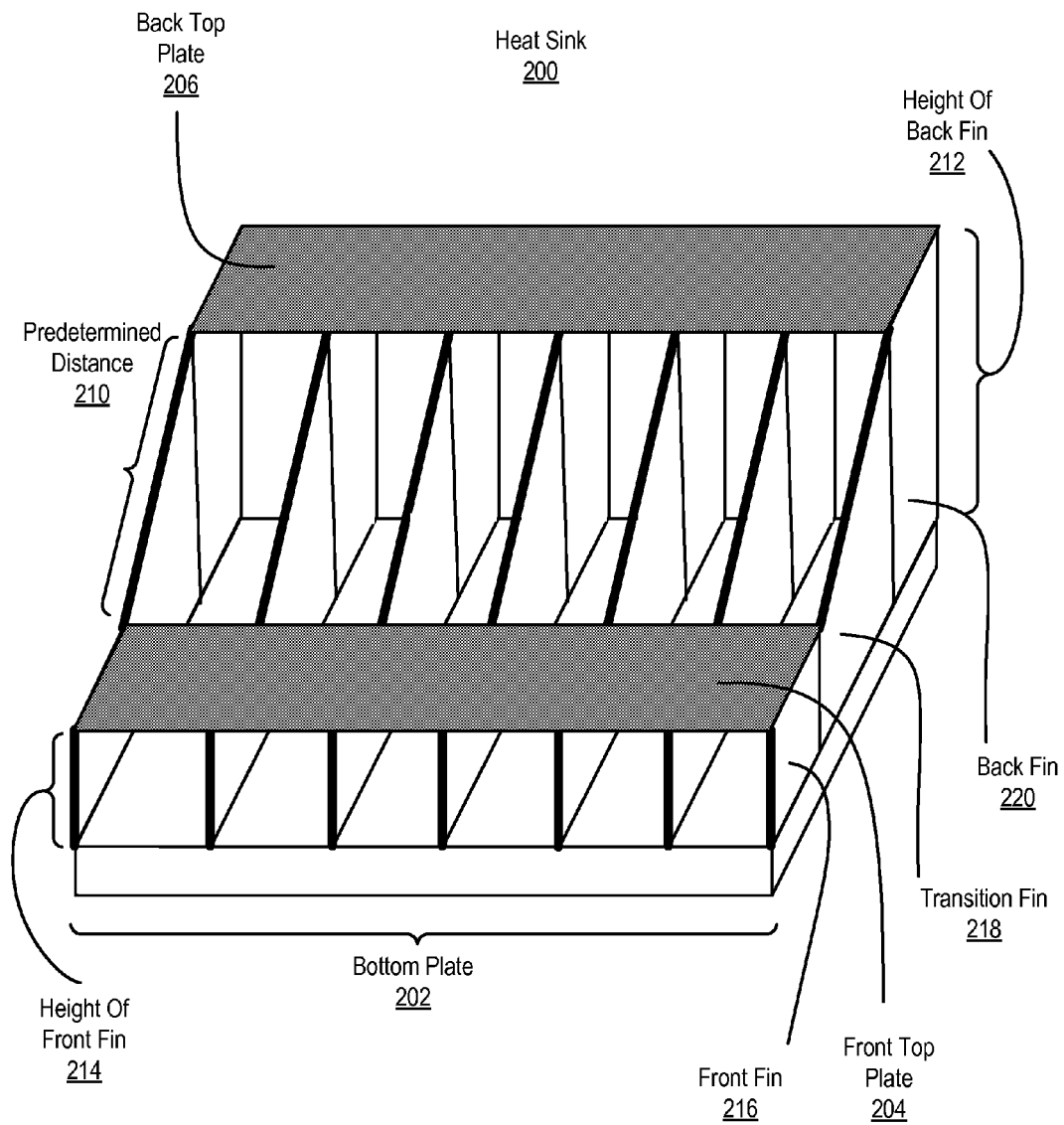
FIG. 2 sets forth a perspective view of a heat sink for distributing a thermal load.

For further explanation, FIG. 2 sets forth a perspective view of a heat sink (200) for distributing a thermal load according to embodiments of the present invention. In the example of FIG. 2, the heat sink (200) includes a bottom plate (202) that may thermally connect the heat sink (200) to an integrated circuit package such as, for example, a computer processor. The heat sink (200) of FIG. 2 also includes a plurality of heat-dissipating front fins (216) connected to the bottom plate (202), a plurality of heat-dissipating back fins (220) connected to the bottom plate (202), and a plurality of heat-dissipating transition fins (218) connected to the bottom plate (202). In the example of FIG. 2, each heat-dissipating transition fin (218) is also connected to a heat-dissipating front fin (216) and a heat-dissipating back fin (220). The heat-dissipating front fins (216), the heat-dissipating back fins (220), and the heat-dissipating transition fins (218) may each receive a thermal load from the bottom plate (202).

In the example of FIG. 2, the front top plate (204) is connected to the heat-dissipating front fins (216) and the back top plate (206) is connected to the heat-dissipating back fins (220). In the example of FIG. 2, the front top plate (204) may receive a thermal load from the bottom plate (202) via the heat-dissipating front fins (216). The back top plate (206) of FIG. 2 may receive a thermal load from the bottom plate (202) via the heat-dissipating back fins (220).

In the example of FIG. 2, the front top plate (204) and the back top plate (206) are separated by a predetermined distance (210) that corresponds to the length of the top edge of each transition fin (218) that is connected to and in between a front fin (216) and a back fin (220) thereby creating an opening between the front top plate (204) and the back top plate (206) and exposing one or more interior chambers between two particular adjacent heat-dissipating front fins (216), between two particular adjacent heat-dissipating back fins (220), or between two particular adjacent heat-dissipating transition fins (218). The heat sink (200) of FIG. 2 includes an opening in the sense that the transition fins (218) are not connected to a top plate, thereby enabling airflow to enter and exit the heat sink (200) at the opening between the front top plate (204) and the back top plate (206). Airflow may be provided to the heat sink (200) through the use of one or more cool air sources, such as one or more fans, that deliver one or more streams of airflow to the heat sink (200). As such, cool air may enter the heat sink (200) via the opening between the front top plate (204) and the back top plate (206) and hot air may exit the via the opening between the front top plate (204) and the back top plate (206).

In the example of FIG. 2, a height (212) of each heat-dissipating back fin (220) may be greater than a height (214) of each heat-dissipating front fin (216) by a predetermined amount. For example, the height (212) of each heat-dissipating back fin (220) may be approximately twice the height (214) of each heat-dissipating front fin (216). Because the height (212) of each heat-dissipating back fin (220) is greater than the height (214) of each heat-dissipating front fin (216), cool air may be delivered to the opening between the front top plate (204) and the back top plate (206) by a cool air source, such as one or more fans, that are mounted in front of the heat sink (200). In an embodiment in which there was no difference in height between each heat-dissipating back fin (220) and each heat-dissipating front fin (216), a cool air source mounted in front of the heat sink (200) could not efficiently deliver airflow to an opening in the heat sink. For example, the cool air source could be mounted directly above the heat sink (200) in order to deliver cool air via the opening between the front top plate (204) and the back top plate (206), the cool air source could use a duct to deliver cool air via the opening between the front top plate (204) and the back top plate (206), or the cool air source could make use of other air delivery mechanisms. In the example of FIG. 2, because there is a difference between the height (212) of each heat-dissipating back fin (220) and the height (214) of each heat-dissipating front fin (216), cool air can be delivered not only via a duct or from a cool air source mounted above the heat sink (200) but also by a cool air source mounted in front of the heat sink (200) and oriented to deliver air flow that flows above the top of each heat-dissipating front fin (216) and below the top of each heat-dissipating back fin (220).

In the example of FIG. 2, the front top plate (204) and the back top plate (206) are depicted as being identically sized. Although the front top plate (204) and the back top plate (206) may be identically sized, the front top plate (204) and the back top plate (206) may also be differently sized. For example, the depth, width, thickness, or other dimension of the front top plate (204) and the back top plate (206) of FIG. 2 may be different.

In the example of FIG. 2, the heat-dissipating front fins (216), heat-dissipating back fins (220), and heat-dissipating transition fins (218) are oriented with respect to one or more fans (not shown) such that airflow from the fans is received via an opening in the heat sink between the front top plate (204) and the back top plate (206). The airflow from the fan may be received via the opening in the heat sink between the front top plate (204) and the back top plate (206) such that cool air provided by the fan is ducted into the heat sink (200). The cool air ducted into the heat sink (200) may be used to reduce the temperature of the front top plate (204), the back top plate (206), the heat-dissipating front fins (216), the heat-dissipating transition fins (218), and the heat-dissipating back fins (220) and to also reduce the ambient temperature of air that is within the heat sink (200).

Figure 3:
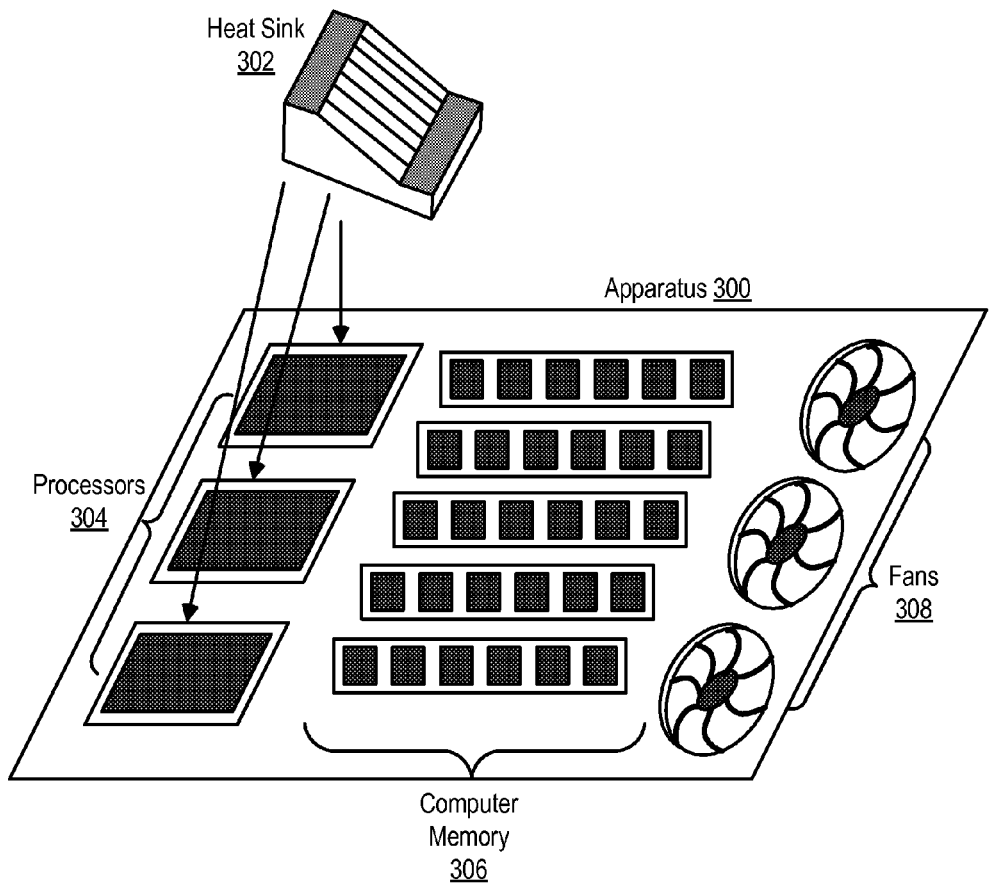
FIG. 3 sets forth a perspective view of an apparatus configured to distribute a thermal load.

For further explanation, FIG. 3 sets forth a perspective view of an apparatus (300) configured to distribute a thermal load. In the example of FIG. 3, the apparatus (300) may be embodied, for example, as a motherboard or other computing device that includes one or more computer processors (304) and computer memory (306) operatively coupled to the one or more computer processors (304). In the example of FIG. 3, the computer processor (304) may be embodied, for example, as a central processing unit (CPU), a microprocessor, an arithmetic/logic unit ('ALU'), a special purpose integrated circuit, and so on. The computer memory (306) of FIG. 3 may be embodied, for example, as random access memory (RAM), one or more dual in-line memory modules ('DIMM'), one or more single in-line memory modules ('SIMM'), and so on.

In the example of FIG. 3, the apparatus (300) also includes a heat sink (302) for distributing a thermal load. The heat sink (302) of FIG. 3 may be embodied as described above with reference to FIG. 1 and FIG. 2. The heat sink (302) of FIG. 3 may therefore include a bottom plate, a front top plate, a back top plate, and a plurality of heat-dissipating fins connected to the bottom plate, the front top plate, and the back top plate. In the example of FIG. 3, the front top plate and the back top plate are separated by a predetermined distance thereby creating an opening between the front top plate and the back top plate and exposing one or more interior chambers between two particular adjacent heat-dissipating fins. The heat sink (302) of FIG. 3 includes an opening in the sense that some portions of the heat-dissipating fins are connected to the front top plate or the back top plate while other portions of the heat-dissipating fins are not connected to a top plate, thereby enabling airflow to enter and exit the opening. Airflow may be provided to the heat sink (302) through the use of one or more cool air sources, such as one or more fans, that deliver one or more streams of airflow to the heat sink (302). Airflow entering the heat sink (302) via the opening may flow into the interior chambers of the heat sink (302). In the example of FIG. 3, such interior chambers represent the space between two adjacent heat-dissipating fins. Cool air may therefore enter the heat sink (302) of FIG. 3 via the opening between the front top plate and the back top plate and hot air may exit the via the opening between the front top plate and the back top plate.

In the example of FIG. 3, the apparatus (300) also includes one or more fans (308) oriented to deliver air flow to an opening in the heat sink (302) between the front top plate and the back top plate. In the example of FIG. 3, the height of a back portion of each heat-dissipating fin is greater than a height of a front portion of each heat-dissipating fin by a predetermined amount. For example, the height of the back portion of each heat-dissipating fin may be approximately twice the height of the front portion of each heat-dissipating fin. Because the height of the height of the back portion of each heat-dissipating fin is greater than the height of the front portion of each heat-dissipating fin, airflow may enter the heat sink (302) from the one or more fans (308) that are included in the apparatus (302).

For further explanation, consider an embodiment in which the computer memory (306) modules of FIG. 3 have a height of one unit, the front portion of each heat sink (302) has a height of one unit, the back portion of each heat sink (302) has a height of two units, and each fan (308) has a height of two units. In such an example, a portion of the airflow generated by each fan (308) would be blocked by the computer memory (306) modules that have a height of one unit. Another portion of the airflow generated by each fan (308), however, would not be blocked by the computer memory (306) modules that have a height of one unit given that the fans (308) have a height of two units. In other words, some airflow from the fans (308) would flow over the top of the computer memory (306) modules. This airflow generated by the fans (308) that is not blocked by the computer memory (306) modules could enter into a heat sink (302) via the opening in the heat sink (302) between the front portion of each heat sink (302), with its height of one unit, and the back portion of each heat sink (302), with its height of two units, thereby delivering cool air to each heat sink (302).

In the example of FIG. 3, the front top plate and the back top plate of the heat sink (302) may be identically sized. In other embodiments, the front top plate and the back top plate of the heat sink (302) may be differently sized. For example, the depth, width, thickness, or other dimension of the front top plate and the back top plate of the heat sink (302) may be different.

In the example of FIG. 3, a heat sink (302) may be mounted on each of the computer processors (304). The heat sink (302) may therefore act as a thermal conductor configured to absorb and dissipate the thermal load from the computer processors (304). The heat sink (302) of FIG. 3 may absorb the thermal load from the computer processors (304) through thermal conduction. When thermally connecting the heat sink (302) to the computer processors (304), the heat sink (302) provides additional thermal mass, cooler than the computer processors (304), into which the thermal load may flow. After absorbing the thermal load, the heat sink (302) may dissipate the thermal load through thermal convection and thermal radiation into the air surrounding the heat sink (302).

For further explanation, FIG. 4 sets forth a flow chart illustrating an exemplary method for distributing a thermal load according to embodiments of the present invention that includes receiving (402), in a heat sink, a thermal load from a thermal source. In the example of FIG. 4, the heat sink includes a bottom plate, a front top plate, a back top plate, and a plurality of heat-dissipating fins connected to the bottom plate, the front top plate, and the back top plate. In the example of FIG. 4, the front top plate and the back top plate are separated by a predetermined distance thereby creating an opening between the front top plate and the back top plate and exposing one or more interior chambers between two particular adjacent heat-dissipating fins as described above with reference to FIGS. 1-3.

In the example of FIG. 4, the thermal source may be a computer processor such as, for example, a CPU, a microprocessor, an ALU, a special purpose integrated circuit, and so on. Receiving (402) a thermal load from such a thermal source may be carried out, for example, by physically connecting a portion of the heat sink, such as the bottom plate, to the thermal source such that thermal energy from the thermal source is transferred to the heat sink via heat flow or heat exchange until thermal equilibrium between the thermal source and the bottom plate is reached.

The example of FIG. 4 also includes transferring (404) the thermal load to the heat-dissipating fins, the front top plate, and the back top plate, through a conductive heat path. In the example of FIG. 4, the conductive heat path may be the heat-dissipating fins, the front top plate, and the back top plate themselves. For example, the heat-dissipating fins may be physically in contact with the bottom plate that is physically connected to the thermal source. Likewise, the front top plate and back top plate may be physically connected to the heat-dissipating fins. In such an example, a thermal load from the thermal source that is received by the bottom plate can be transferred to the heat-dissipating fins, the front top plate, and the back top plate via heat flow or heat exchange until thermal equilibrium between the thermal source and the heat sink is reached.

The example of FIG. 4 also includes receiving (406), via an opening in the heat sink between the front top plate and the back top plate of the heat sink, airflow from an air source. In the example of FIG. 4, the air source may be embodied, for example, as a fan, blower, or other device capable of creating air flow. Airflow generated by such an air source may flow into the cavities of the heat sink that exist between each heat-dissipating fin. Such airflow may represent cooler air than currently exists within the heat sink such that the airflow reduces the ambient temperature of air within the heat sink, causing a reduction in the temperature of the heat-dissipating fins, the front top plate, and the back top plate, thereby enabling the heat sink to absorb a larger thermal load than would be possible absent the airflow from the air source.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A heat sink for distributing a thermal load, the heat sink comprising:
    a bottom plate;
    a front top plate;
    a back top plate; and
    a plurality of heat-dissipating fins connected to the bottom plate, the front top plate, and the back top plate, wherein the front top plate and the back top plate are separated by a predetermined distance thereby creating an opening between the front top plate and the back top plate and exposing one or more interior chambers between two particular adjacent heat-dissipating fins, wherein the front top plate and the back top plate are identically sized, and, wherein a height of a back portion of each heat-dissipating fin is greater than a height of a front portion of each heat-dissipating fin by a predetermined amount.

2. The heat sink of claim 1 wherein a height of a back portion of each heat-dissipating fin is approximately twice a height of a front portion of each heat-dissipating fin.

3. The heat sink of claim 1 wherein the heat-dissipating fins are oriented with respect to a fan such that airflow from the fan is received via an opening in the heat sink between the front top plate and the back top plate.

4. A heat sink for distributing a thermal load, the heat sink comprising:
    a bottom plate;
    a plurality of heat-dissipating front fins connected to the bottom plate;
    a plurality of heat-dissipating back fins connected to the bottom plate;
    a plurality of heat-dissipating transition fins connected to the bottom plate,
    wherein each heat-dissipating transition fin is connected to a heat-dissipating front fin and a heat-dissipating back fin;
    a front top plate connected to the heat-dissipating front fins; and
    a back top plate connected to the heat-dissipating back fins thereby creating an opening between the front top plate and the back top plate and exposing one or more interior chambers between two particular adjacent heat-dissipating front fins, between two particular adjacent heat-dissipating back fins, or between two particular adjacent heat-dissipating transition fins, wherein the front top plate and the back top plate are identically sized, and, wherein a height of a back portion of each heat-dissipating fin is greater than a height of a front portion of each heat-dissipating fin by a predetermined amount.

5. The heat sink of claim 4 wherein a height of a each heat-dissipating back fin is approximately twice a height of a each heat-dissipating front fin.

6. The heat sink of claim 4 wherein the heat-dissipating front fins, heat-dissipating back fins, and heat-dissipating transition fins are oriented with respect to a fan such that airflow from the fan is received via an opening in the heat sink between the front top plate and the back top plate.

7. Apparatus configured to distribute a thermal load, the apparatus comprising:
    a computer processor;
    a computer memory operatively coupled to the computer processor; and
    a heat sink for distributing a thermal load, the heat sink comprising:
        a bottom plate;
        a front top plate;
        a back top plate; and
        a plurality of heat-dissipating fins connected to the bottom plate, the front top plate, and the back top plate, wherein the front top plate and the back top plate are separated by a predetermined distance thereby creating an opening between the front top plate and the back top plate and exposing one or more interior chambers between two particular adjacent heat-dissipating fins, wherein the front top plate and the back top plate are identically sized, and, wherein a height of a back portion of each heat-dissipating fin is greater than a height of a front portion of each heat-dissipating fin by a predetermined amount.

8. The apparatus of claim 7 wherein a height of a back portion of each heat-dissipating fin is twice a height of a front portion of each heat-dissipating fin.

9. The apparatus of claim 7 further comprising a fan oriented to deliver air flow to an opening in the heat sink between the front top plate and the back top plate.

10. The apparatus of claim 7 wherein the heat sink is mounted on the computer processor.

11. A method for dissipating a thermal load, the method comprising:
    receiving, in a heat sink, a thermal load from a thermal source, wherein the heat sink includes:

a bottom plate;

a front top plate;

a back top plate; and a plurality of heat-dissipating fins connected to the bottom plate, the front top plate, and the back top plate, wherein the front top plate and the back top plate are separated by a predetermined distance thereby creating an opening between the front top plate and the back top plate and exposing one or more interior chambers between two particular adjacent heat-dissipating fins, wherein the front top plate and the back top plate are identically sized, and, wherein a height of a back portion of each heat-dissipating fin is greater than a height of a front portion of each heat-dissipating fin by a predetermined amount; and transferring the thermal load to the heat-dissipating fins, the front top plate, and the back top plate, through a conductive heat path.

12. The method of claim 11 further comprising receiving, via an opening in the heat sink between the front top plate and the back top plate of the heat sink, airflow from an air source.

13. The method of claim 12 wherein the air source is a fan.

14. The method of claim 11 wherein the thermal source is a computer processor.

* * * * *